(12) United States Patent
Huang et al.

(10) Patent No.: US 8,958,212 B2
(45) Date of Patent: Feb. 17, 2015

(54) ELECTRONIC DEVICE

(75) Inventors: Pai-Ching Huang, Taipei (TW); Tsung-Fu Hung, Taipei (TW); Li-Chien Wu, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 330 days.

(21) Appl. No.: 13/337,287

(22) Filed: Dec. 27, 2011

(65) Prior Publication Data

US 2012/0170238 A1  Jul. 5, 2012

Related U.S. Application Data

(60) Provisional application No. 61/429,769, filed on Jan. 5, 2011.

(30) Foreign Application Priority Data

May 4, 2011  (TW) .............................. 100115624 A

(51) Int. Cl.
*H05K 7/10*   (2006.01)
*H05K 5/02*   (2006.01)
*H01R 12/70*  (2011.01)
*H01R 12/71*  (2011.01)

(52) U.S. Cl.
CPC .......... *H05K 5/0278* (2013.01); *H01R 12/7076* (2013.01); *H01R 12/716* (2013.01); *H01R 2201/06* (2013.01)
USPC ......... 361/767; 361/720; 361/760; 439/541.5

(58) Field of Classification Search
CPC ............. H05K 5/0278; H01R 12/7076; H01R 12/0278; H01R 12/716; H01R 2201/06; H01R 13/6658; G06F 1/185; G06F 1/186
USPC ........................................ 361/767; 439/541.5
See application file for complete search history.

(56) References Cited

U.S. PATENT DOCUMENTS

| 6,862,804 | B2 | 3/2005 | Nishio et al. |
| 8,437,710 | B2 * | 5/2013 | Mo ................................. 455/91 |
| 2010/0159748 | A1 * | 6/2010 | Chang ...................... 439/620.22 |
| 2010/0267255 | A1 * | 10/2010 | Mo ................................. 439/74 |

FOREIGN PATENT DOCUMENTS

| CN | 201289941 | 8/2009 |
| CN | 201435474 | 3/2010 |
| TW | M355480 | 4/2009 |
| TW | M359074 | 6/2009 |
| TW | M362527 | 8/2009 |
| TW | M403159 | 5/2011 |

\* cited by examiner

*Primary Examiner* — Robert J Hoffberg
*Assistant Examiner* — Mukund G Patel
(74) *Attorney, Agent, or Firm* — Jianq Chyun IP Office

(57) ABSTRACT

An electronic device includes a circuit board, a connector and an electronic module. The connector includes an insulating body and a first terminal set. The insulating body includes a concave. The first terminal set is fastened on the insulating body and is electrically connected to the circuit board. The electronic module is detachably disposed in the concave and includes a second terminal set. The second terminal set contacts the first terminal set to be electrically connected to the circuit board.

14 Claims, 5 Drawing Sheets

ELECTRONIC DEVICE

CROSS-REFERENCE TO RELATED APPLICATION

This application claims the priority benefits of U.S. provisional application Ser. No. 61/429,769, filed on Jan. 5, 2011 and Taiwan application serial no. 100115624, filed on May 4, 2011. The entirety of each of the above-mentioned patent applications is hereby incorporated by reference herein and made a part of this specification.

BACKGROUND OF THE INVENTION

1. Field of the Invention

The present invention relates to an electronic device and, more particularly, to an electronic device with a circuit board.

2. Description of the Related Art

With the development and wide usage of wireless transmission technology, most electronic devices, such as a notebook computer, a desktop computer and an all-in-one computer, include a wireless transmission module. The wireless transmission module may be a blue tooth transmission module, a wireless fidelity (Wi-Fi) transmission module, a worldwide interoperability for microwave access (WiMAX) transmission module, a third generation mobile (3G) transmission module or a frequency modulation (FM) receiving module.

A wireless transmission module is usually attached onto a motherboard of the electronic device by soldering and thus is difficult to be detached. Consequently, if the wireless transmission module has to be replaced, it needs to be de-soldered first and a new wireless transmission module is welded onto the motherboard, which is rather complicated. Moreover, the wireless transmission module disposed in the electronic devices needs to be certificated in many countries, if the wireless transmission module is welded onto the motherboard, it would be classified as an "undetachable wireless transmission module", which needs to be certificated together with the motherboard, and will cost much more fee and time.

BRIEF SUMMARY OF THE INVENTION

An electronic device having a detachable electronic module is provided. The electronic module can be detached from a circuit board of the electronic device.

An electronic device includes a circuit board, a connector and an electronic module. The connector includes an insulating body and a first terminal set. The insulating body includes a concave. The first terminal set is fastened on the insulating body and welded to the circuit board. The electronic module is detachably disposed in the concave and includes a second terminal set. The second terminal set contacts the first terminal set to be electrically connected to the circuit board.

These and other features, aspects and advantages of the present invention will become better understood with regard to the following description, appended claims, and accompanying drawings.

DETAILED DESCRIPTION OF THE EMBODIMENTS

Figure 1:
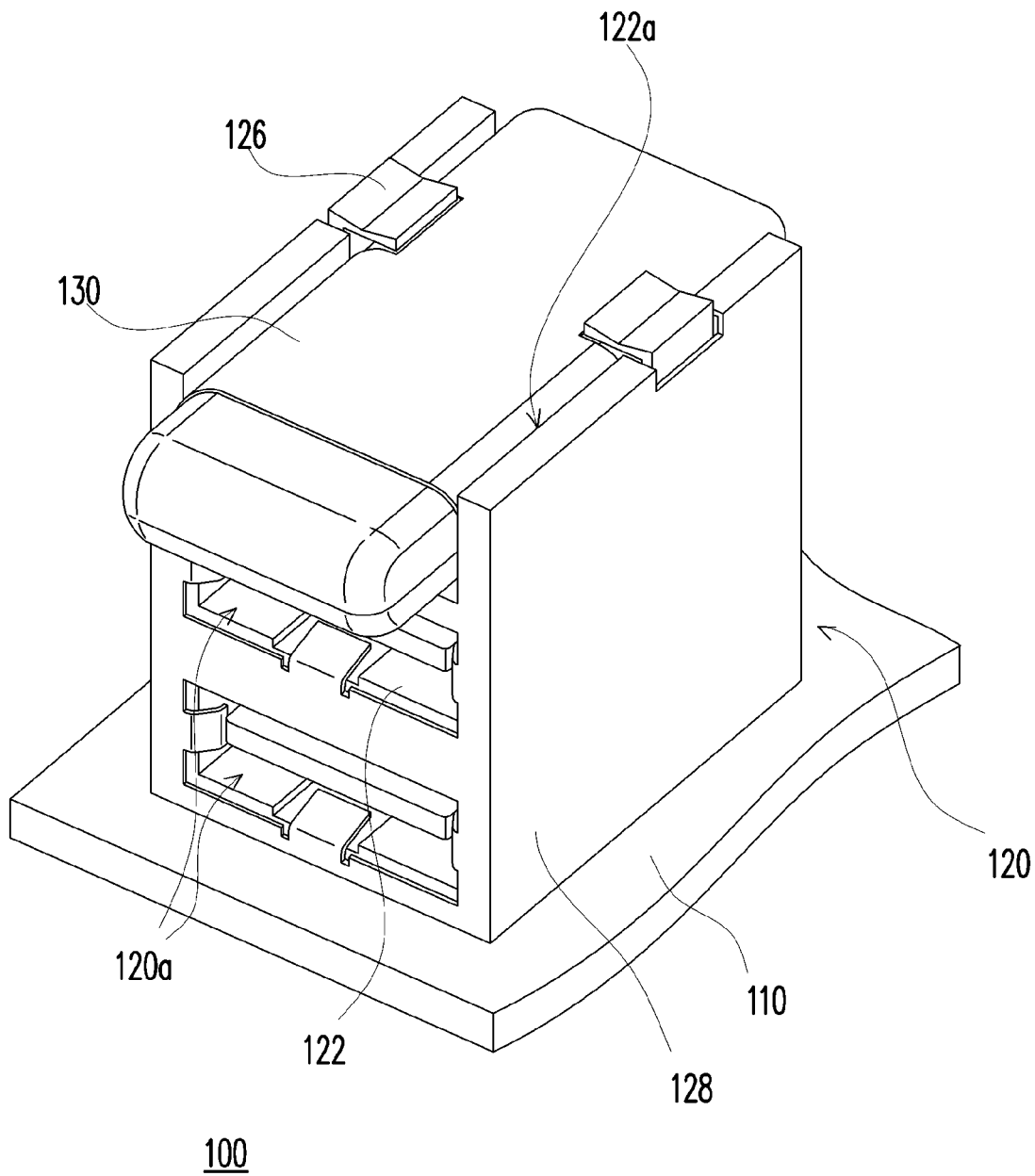
FIG. 1 is a schematic diagram showing an electronic device in a first embodiment.
Figure 2:
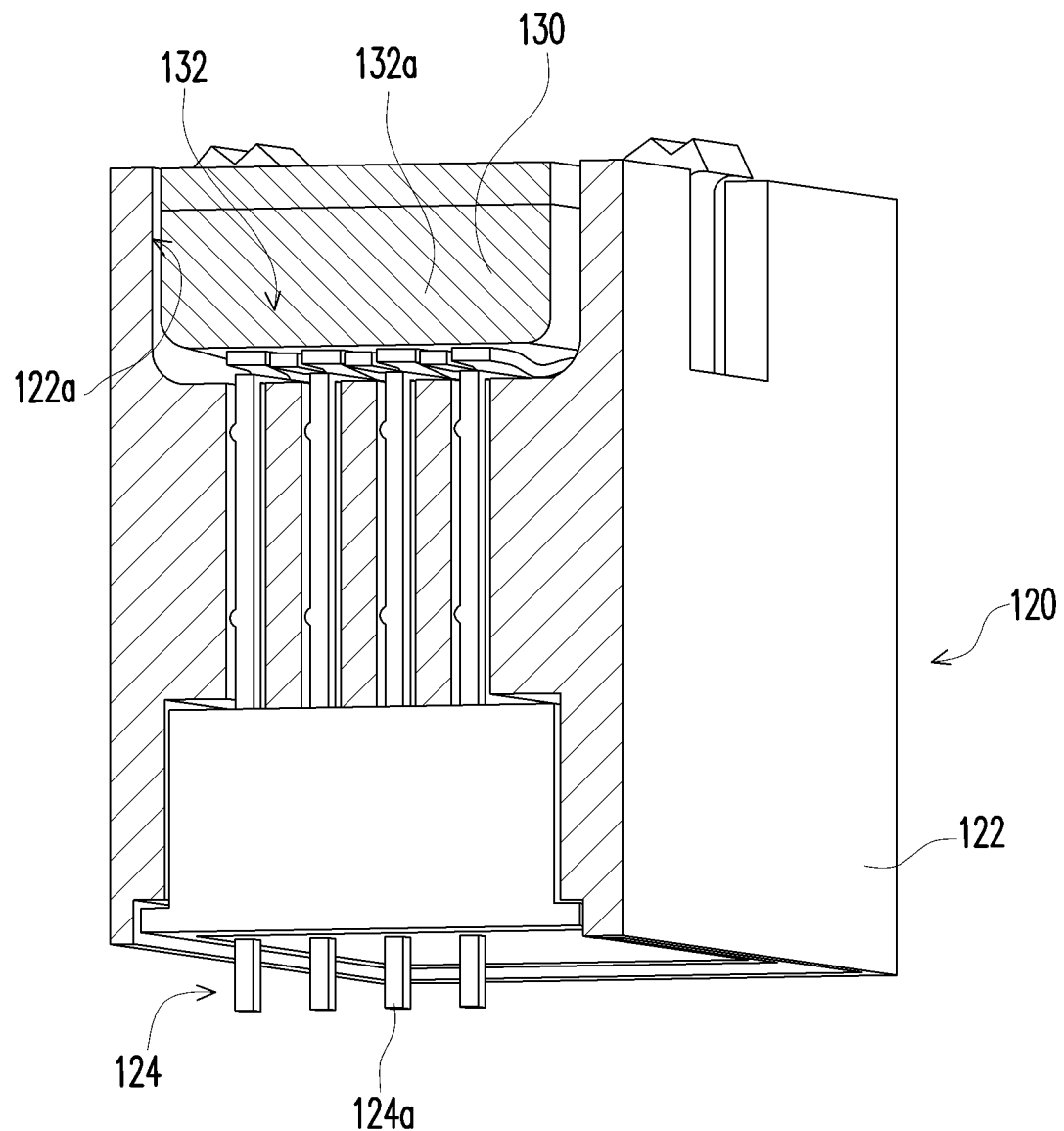
FIG. 2 is a schematic diagram showing a part of components of the electronic device in FIG. 1.

FIG. 1 is a schematic diagram showing an electronic device in a first embodiment. FIG. 2 is a schematic diagram showing a part of components of the electronic device in FIG. 1. The electronic device 100 includes a circuit board 110, a connector 120 and an electronic module 130. The connector 120 includes an insulating body 122 and a first terminal set 124. The insulating body 122 has a concave 122a. The first terminal set 124 is fastened on the insulating body 122 and welded to the circuit board 110. The electronic module 130 is detachably disposed in the concave 122a and includes a second terminal set 132. The second terminal set 132 contacts the first terminal set 124 to be electrically connected to the circuit board 110.

Since the electronic module 130 is not fixed on the circuit board 110 by welding, it is convenient to be detached from the connector 120 and to replace a new electronic module 130 to the connector 120, which simplifies the maintenance process. Moreover, the electronic module 130 can be certificated individually without the circuit board 110, which saves certification fee and time.

The electronic module 130 may be a wireless transmission module, and the circuit board 110 may be a motherboard disposed in a notebook computer, a desktop computer or an all-in-one computer. For example, the electronic module 130 may be a blue tooth transmission module, a wireless fidelity (Wi-Fi) transmission module, a worldwide interoperability for microwave access (WiMAX) transmission module, a third generation mobile (3G) transmission module or a frequency modulation (FM) receiving module, which is not limited herein.

Figure 3:
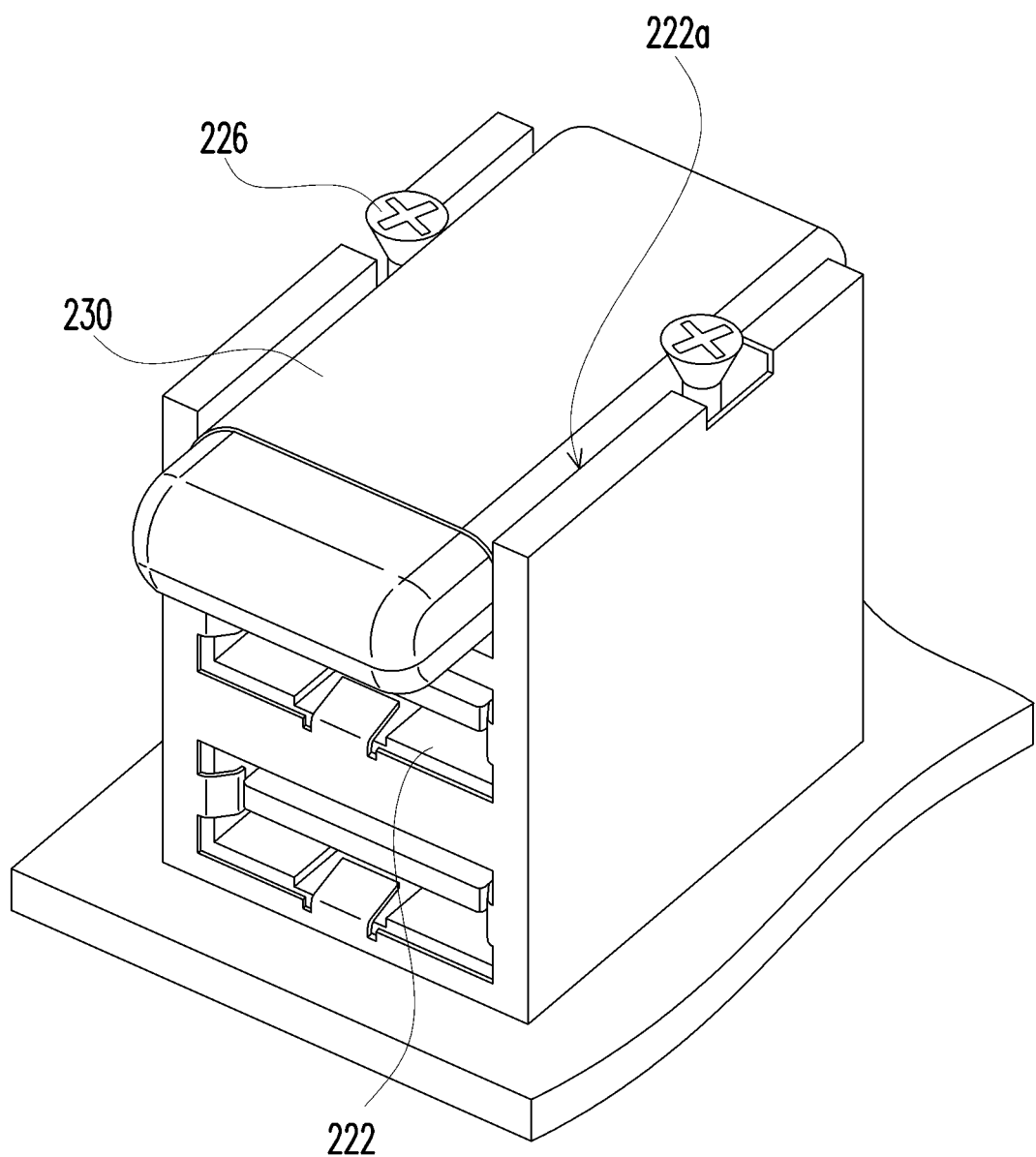
FIG. 3 is a schematic diagram showing an electronic device in a second embodiment.

The connector 120 further includes at least a fastening element 126 (the connector 120 includes two fastening elements 126 in FIG. 1). The fastening element 126 is connected to the insulating body 122 and fastens the electronic module 130 to the insulating body 122. The fastening element 126 may be a locking part formed by a part of the insulating body 122 and locks the electronic module 130 in the concave 122a of the insulating body 122, which is not limited herein. For example as showed in FIG. 3, which is a schematic diagram showing an electronic device in a second embodiment. The multiple fastening elements 226 are screws for fastening the electronic module 230 in the concave 222a of the insulating body 222.

In FIG. 1, the connector 120 further includes a metal casing 128. The metal casing 128 covers the insulating body 122 and is connected to a ground end (not shown) at the circuit board 110. Electromagnetic wave from the electronic module 130 can be shielded by the metal casing 128, so as to improve electromagnetic interference (EMI) shielding effect.

The first terminal set 124 and the second terminal set 132 may be adapted to universal serial bus (USB) interfaces, peripheral component interconnection express (PCI-E) interfaces or IEEE1394 interfaces, which is not limited herein. The connector 120 may further includes at least an I/O port 120a (two I/O ports 120a are included as shown in FIG. 1). The I/O port 120a may be a USB interface, an RJ45 interface or an IEEE1394 interface, which is not limited herein. In an embodiment, the I/O port 120a is integrated into the connector 120 to save configuration space.

In FIG. 2, the first terminal set 124 includes a plurality of first pins 124a, and the second terminal set 132 includes a plurality of second pins 132a. One end of each of the first pins 124a is welded to the circuit board 110 (as shown in FIG. 1), the other end of each of the first pins 124a contacts the corresponding second pin 132a to make the second pins 132a electrically connected to the circuit board 110 via the first pins 124a, respectively. Types of the first terminal set 124 and the second terminal set 132 are not limited herein.

Figure 4:
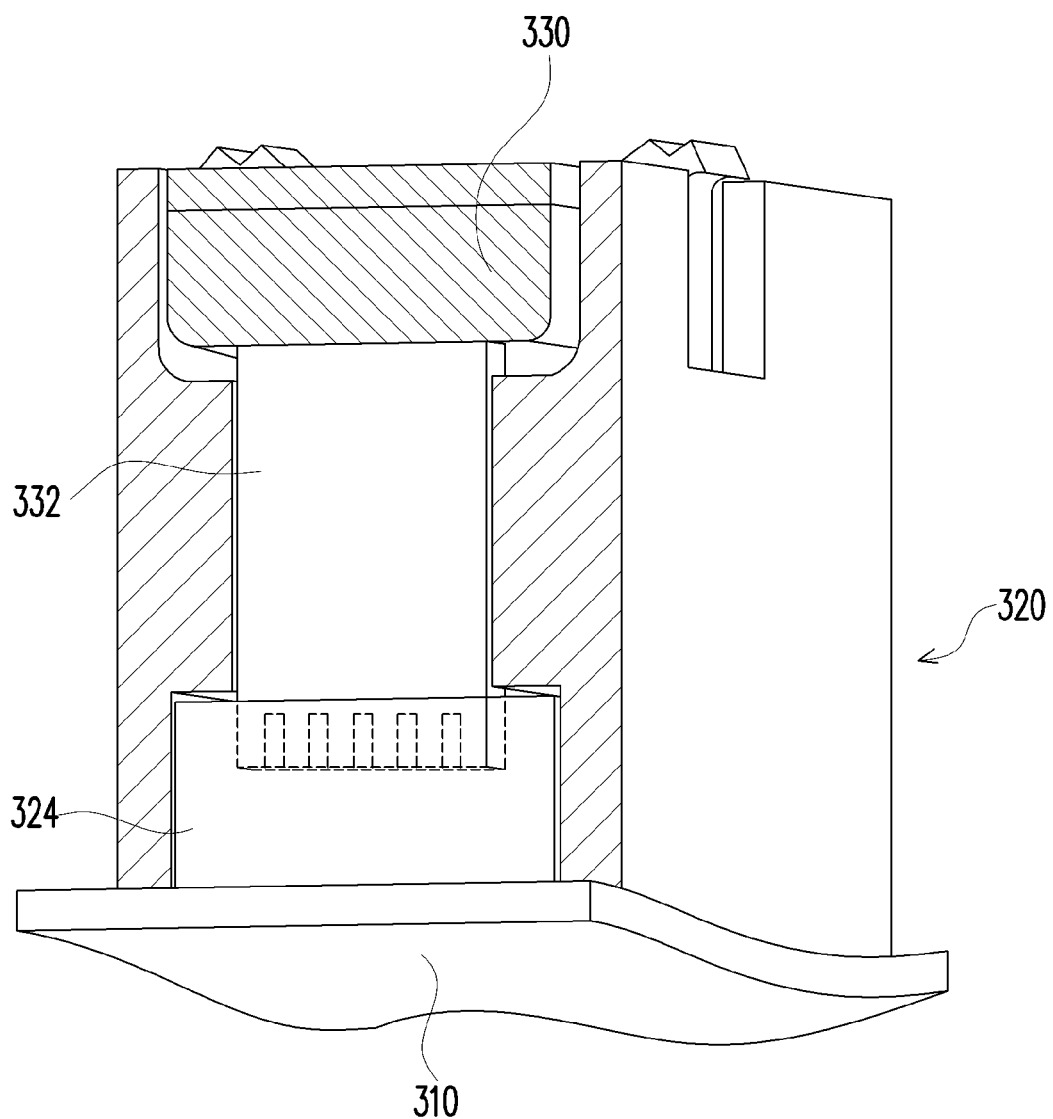
FIG. 4 is a schematic diagram showing a part of components of an electronic device in a third embodiment.

FIG. 4 is a schematic diagram showing a part of components of an electronic device in a third embodiment. The first terminal set 324 of the connector 320 is formed in a slot and electrically connected to the circuit board 310. The second terminal set 332 of the electronic module 330 is a card module, when the card module inserted to the slot, the second terminal set 332 electrically connected to the circuit board 310.

Figure 5:
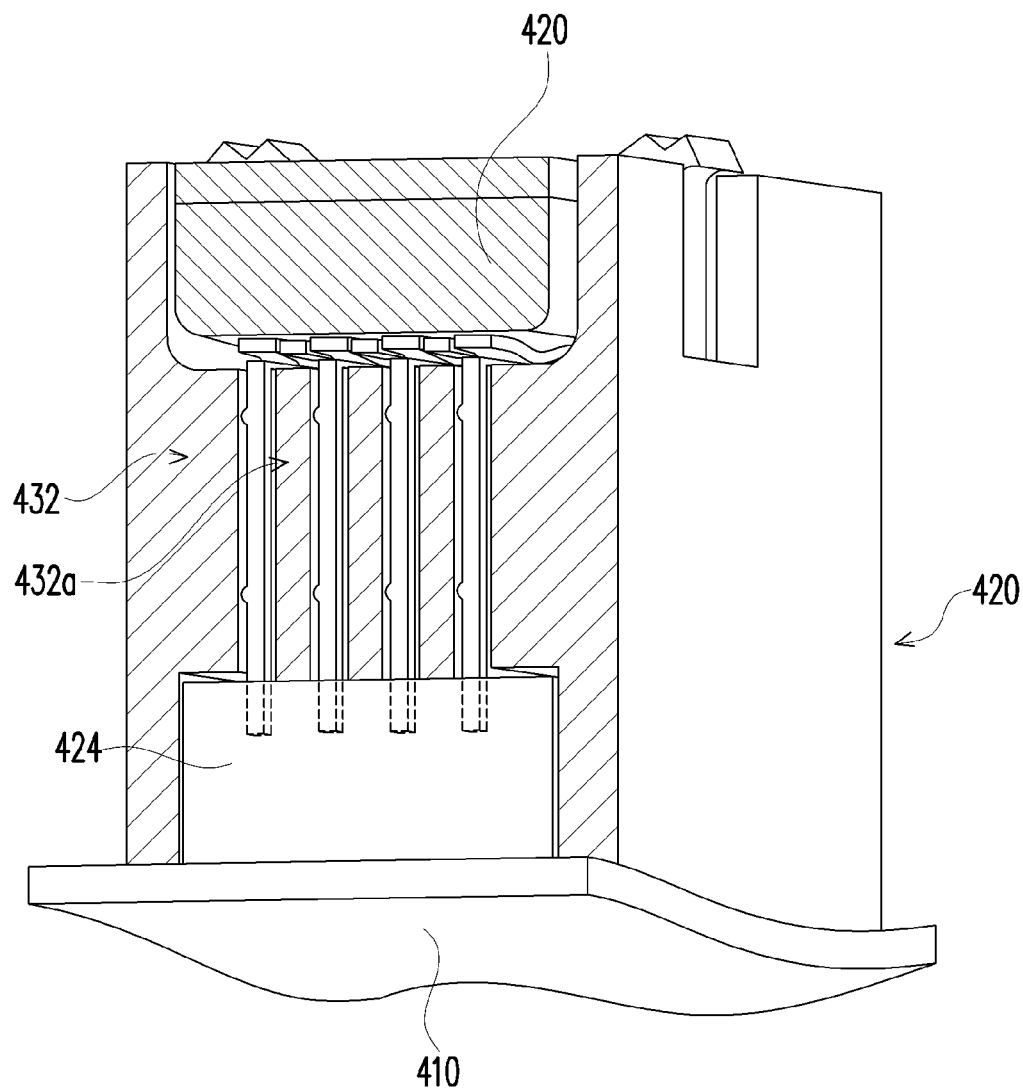
FIG. 5 is a schematic diagram showing a part of components of an electronic device in a fourth embodiment.

FIG. 5 is a schematic diagram showing a part of components of an electronic device in a fourth embodiment. The first terminal set 424 of the connector 420 is a pin header connector electrically connected to the circuit board 410. The second terminal set 432 includes a plurality of pin headers 432a, the pin headers 432a inserts to the pin header connector for electrically connected to the circuit board 410.

In sum, the connector in the embodiments is welded to the circuit board, and the electronic module is detachably disposed in the connector and electrically connected to the circuit board via the connector. Since the electronic module is not fastened in the welding way, it is convenient to be detached from the connector and dispose a normal electronic module to the connector, so as to simplify the maintenance. Moreover, the electronic module does not need to be certificated with the circuit board together, which saves certification fee and time. Furthermore, multiple I/O ports are integrated to the connector of the electronic device to save configuration space.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. An electronic device, comprising:
   a circuit board;
   a connector, including:
      an insulating body including a concave;
      a first terminal set fastened on the insulating body and electrically connected to the circuit board; and
      a metal casing covering the insulating body; and
   an electronic module detachably disposed in the concave and including a second terminal set which contacts the first terminal set to be electrically connected to the circuit board, wherein the electronic module has a top surface facing away from the circuit board and entirely exposed by the metal casing.

2. The electronic device according to claim 1, wherein the electronic module is a wireless transmission module.

3. The electronic device according to claim 1, wherein the metal casing is connected to a ground end.

4. The electronic device according to claim 1, wherein the first terminal set includes a plurality of first pins, the second terminal set includes a plurality of second pins, one end of each of the first pins is electrically connected to the circuit board, and the other end of each of the first pins contacts the corresponding second pin.

5. The electronic device according to claim 1, wherein the first terminal set forms in a slot, the second terminal set forms on a card module, and the card module is inserted into the slot.

6. The electronic device according to claim 1, wherein the first terminal set forms in a pin header connector, the second terminal set includes a plurality of pin headers, and the pin headers inserted into the pin header connector.

7. The electronic device according to claim 1, wherein the first terminal set and the second terminal set are adapted to universal serial bus (USB) interfaces, peripheral component interconnection express (PCI-E) interfaces or IEEE1394 interfaces.

8. The electronic device according to claim 1, wherein the connector further includes a fastening element connected to the insulating body and to fasten the electronic module to the insulating body.

9. The electronic device according to claim 8, wherein the fastening element is a screw.

10. The electronic device according to claim 8, wherein the fastening element is a locking part.

11. The electronic device according to claim 10, wherein the locking part is formed by a part of the insulating body.

12. The electronic device according to claim 1, wherein the connector further includes at least one I/O port.

13. The electronic device according to claim 12, wherein the I/O port is a USB interface, a RJ45 interface or an IEEE1394 interface.

14. The electronic device according to claim 1, wherein the first terminal set is welded to the circuit board.

* * * * *